United States Patent
Tada et al.

[11] Patent Number: 5,935,454
[45] Date of Patent: Aug. 10, 1999

[54] ULTRAFINE FABRICATION METHOD

[75] Inventors: Tetsuya Tada, Tsukuba; Toshihiko Kanayama, Tsuchiura, both of Japan

[73] Assignee: Agency of Industrial Science & Technology, Ministry of International Trade & Industry, Tokyo, Japan

[21] Appl. No.: 08/758,054

[22] Filed: Nov. 27, 1996

[30] Foreign Application Priority Data

Nov. 29, 1995 [JP] Japan ................................ 7-310229

[51] Int. Cl.$^6$ ................................................ C23C 16/00
[52] U.S. Cl. ............................. 216/41; 216/51; 216/52; 216/66; 438/945; 427/533; 427/534; 427/537; 427/552; 427/255.4
[58] Field of Search .................... 216/41, 42, 51, 216/66, 52; 438/945, 947; 427/534, 537, 552, 250, 255.4, 533

[56] References Cited

U.S. PATENT DOCUMENTS

| | | |
|---|---|---|
| 654,867 | 7/1900 | Baker . |
| 4,626,315 | 12/1986 | Kitamoto et al. ................... 156/628 |
| 4,713,258 | 12/1987 | Umemura ............................. 427/35 |
| 4,908,226 | 3/1990 | Kubena et al. ....................... 427/38 |
| 5,064,681 | 11/1991 | Berry et al. .......................... 427/36 |
| 5,196,102 | 3/1993 | Kumar ................................ 427/528 |
| 5,242,544 | 9/1993 | Itoh et al. ............................. 216/97 |
| 5,244,538 | 9/1993 | Kumar ................................ 216/51 |
| 5,250,329 | 10/1993 | Miracky et al. ..................... 427/556 |
| 5,282,925 | 2/1994 | Jeng et al. ............................ 216/79 |
| 5,382,315 | 1/1995 | Kumar ................................ 216/51 |
| 5,429,710 | 7/1995 | Akiba et al. ......................... 216/79 |
| 5,515,984 | 5/1996 | Yokoyama et al. ................... 216/75 |
| 5,647,999 | 7/1997 | Tada et al. ........................... 216/49 |

OTHER PUBLICATIONS

Ehrlich, D.J. et al "Spatially delineated growth of metal films via photochemical prenucleation" Appl. Phys. Lett 38(11) 946–948, Jun. 1981.

*Primary Examiner*—Bruce Breneman
*Assistant Examiner*—Anita Alanko
*Attorney, Agent, or Firm*—Oblon, Spivak, McClelland, Maier & Neustadt, P.C.

[57] ABSTRACT

A method of fabricating nanometric structures on a substrate by dry etching includes setting the substrate at a temperature at which condensation of etching gas products of etching gas decomposed, recombined and reacted, or products of reactions between the etching gas and substrate material starts to occur, forming condensates at specific locations on the substrate. The condensates form an etching mask for the dry etching process.

14 Claims, 2 Drawing Sheets

ULTRAFINE FABRICATION METHOD

BACKGROUND OF THE INVENTION

1. Field of the Invention

This invention relates to a method of using dry etching to efficiently fabricate ultrafine structures having dimensions on the order of 10 nm on a substrate.

2. Description of the Prior Art

Conventional nanometric-scale fabrication procedures used in the manufacture of semiconductor devices such as ICs and LSIs have mainly used electron-beam lithography. However, a drawback of electron-beam lithography is that since it is a sequential process in which a pattern is drawn by scanning a tightly-focussed beam of electrons, it takes a considerable time to draw large numbers of nanometric-scale dots, for example, and thus has a low throughput. Ultrafine fabrication can also be done using optical lithography or X-ray lithography. However, while optical lithography does not have throughput problems, the working principle on which optical lithography is based makes it difficult to form pattern features shorter than half the wavelength of the light, so it cannot be used to form even 100 nm structures. As for X-ray lithography, the masks used are not fine enough, and resolution has not yet reached 10 nm.

An object of the present invention is to provide a method of efficiently fabricating ultrafine structures on the order of 10 nm.

SUMMARY OF THE INVENTION

In accordance with the present invention, the above object is attained by an ultrafine fabrication method in which dry etching is used to form ultrafine structures on a substrate, comprising setting the substrate at a temperature at which condensation of etching gas, products of etching gas decomposed, recombined and reacted, or products of reactions between etching gas and substrate material starts to occur, forming condensates at prescribed positions on the substrate, and dry etching the substrate using the condensates thus formed as an etching mask.

In a preferred embodiment of the ultrafine fabrication method of the invention, dry etching is done after forming condensation nucleation sites on the substrate.

Setting the substrate at a temperature at which condensation starts to occur, as described above, results in the formation of condensates on portions of the substrate. Since the size of the condensates can be controlled to within 10 nm, ultrafine fabrication at a 10 nm level is possible.

When condensation nucleation sites are provided in a required pattern on the substrate before the dry etching, the reaction products condense preferentially around the nucleation sites during etching and form etching masks. The portion without the etching masks are selectively etched, enabling the pattern to be fabricated on the substrate with a precision on the order of 10 nm.

Further features of the invention, its nature and various advantages will be more apparent from the accompanying drawings and following detailed description of the invention.

DESCRIPTION OF THE PREFERRED EMBODIMENT

The inventors conducted extensive research with the aim of developing a method of fabrication ultrafine structures with dimensions around 10 nm, by means that are completely different from conventional lithography techniques. As a result, it was found that when a substrate is dry etched at a temperature at which condensation of the etching gas, products of etching gas decomposed, recombined and reacted, or products of reactions between the etching gas and the substrate material starts to occur, the condensates form an etching mask of nanometric dimensions, enabling nanometric-scale fabrication. It was also found that forming condensation nucleation sites on the substrate prior to the dry etching was highly advantageous to the fabrication process, since the resulting condensation centered on the nucleation sites. The present invention was perfected based on these findings.

There is no particular limitation on the material of the substrate, which may be a metal, an alloy or a ceramic or another such material that has been used for substrates in various sectors such as the electronics and printing industries. Examples of materials that can be used include aluminum, tungsten, titanium, cobalt, iron, silicon, alloys thereof, silicon nitride, gallium arsenide, titanium oxide, silicon oxide, and glass. Of these, silicon is particularly suitable.

In the method of this invention, for the dry etching process the substrate has to be set at a temperature at which condensation of the etching gas, products of etching gas decomposed, recombined and reacted, or products of reactions between the etching gas and the substrate material starts to occur (hereinafter referred to as "condensation initiation temperature"). Dry etching at the condensation initiation temperature results in the condensation of some of the etching gas, products of etching gas decomposed, recombined and reacted, or products of reactions between the etching gas and the substrate material, forming a nanometric etching mask that allows the required pattern to be fabricated. The required pattern can be fabricated by providing the substrate with condensation nucleation sites arranged in a required pattern, before dry etching. Condensates form on the nucleation sites, and portions without nucleation sites are then selectively etched.

Figure 1A:
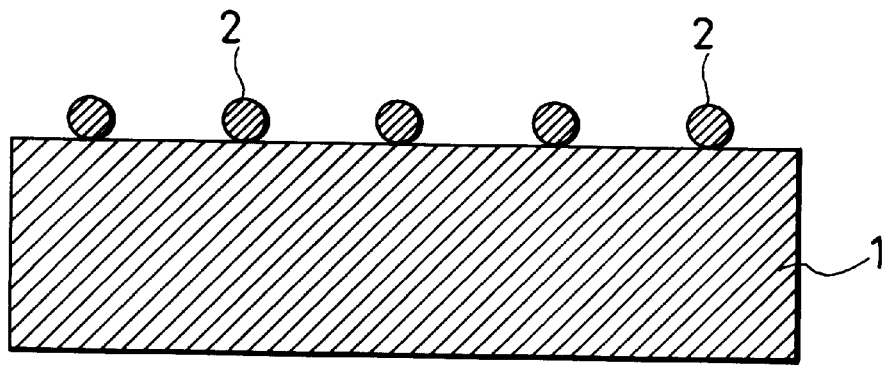
FIG. 1(a) shows condensation nucleation sites formed on a substrate in accordance with the ultrafine fabrication method of this invention.
Figure 1B:
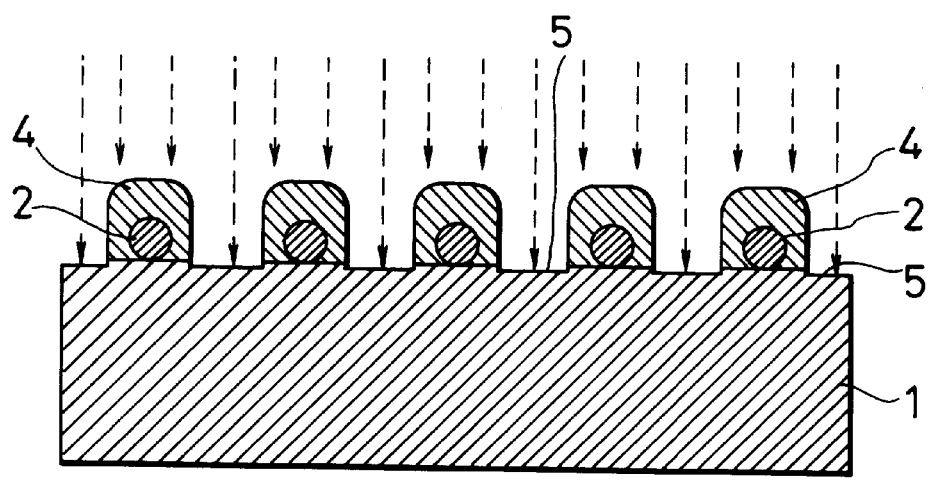
FIG. 1(b) shows reaction products condensed on the condensation nucleation sites of FIG. 1(a)
Figure 1C:
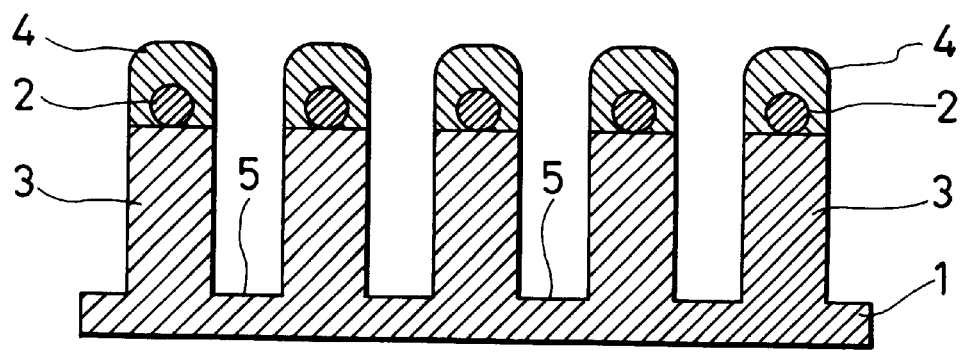
FIG. 1(c) shows the substrate of FIG. 1(a) after dry etching.

FIG. 1 shows an example of the steps used to form ultrafine structures on the substrate, in accordance with the method of this invention. In FIG. 1(a), nucleation sites 2 are formed in a required pattern on a substrate 1 cooled to the condensation initiation temperature. The method used to form the nucleation sites 2 is described below. When dry etching is started, first the reaction products 4 condense at the locations where the nucleation sites 2 have been formed, as shown in FIG. 1(b). When the etching is continued, portions 5 with no nucleation sites 2 are etched, forming pattern structures (pillars) 3, as shown in FIG. 1(c).

Here, dry etching refers to etching of the substrate effected by the volatile products of reactions between the etching gas and the substrate. This dry etching is normally done under reduced pressure conditions. Plasma is normally used in order to produce reaction active radicals.

Figure 2:
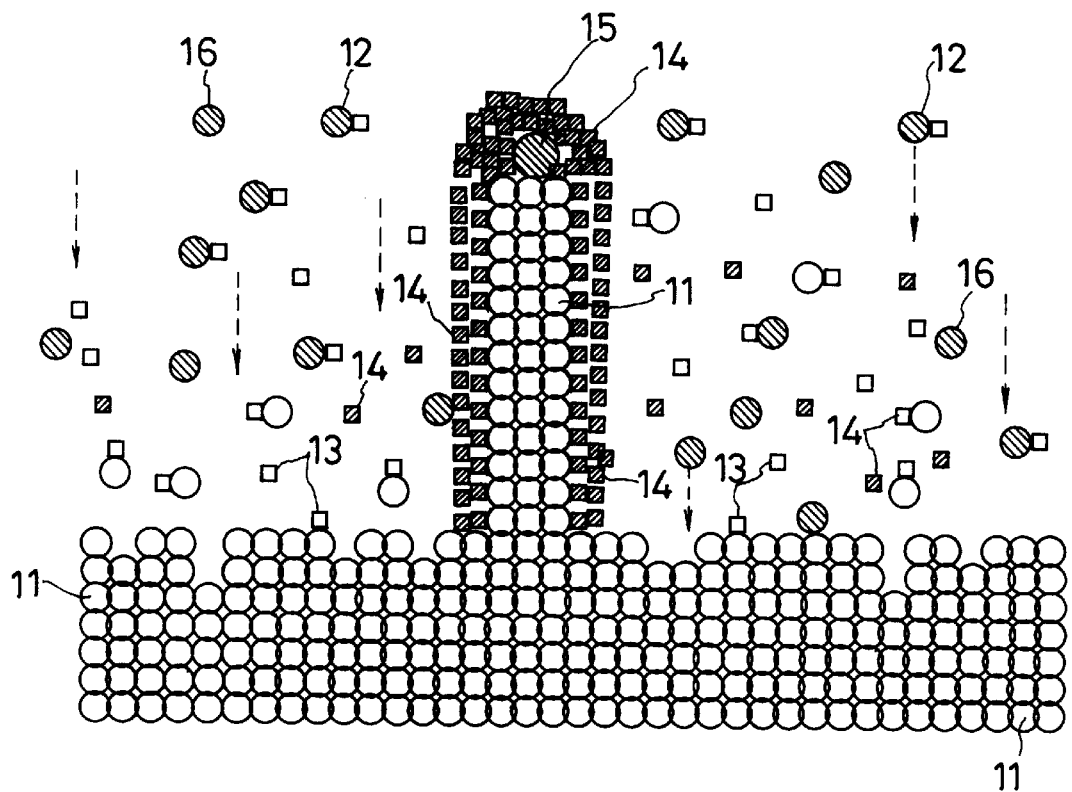
FIG. 2 illustrates the basic principle of the ultrafine fabrication method according to the invention.

FIG. 2 shows the basic principle of the ultrafine fabrication method according to the invention. Liquid nitrogen or other such conventional method is used to cool the substrate to the condensation initiation temperature. When etching is started, radicals 13 of etching gas molecules 12 contact the substrate and react with substrate molecules 11, producing a release of reaction products 14 from the substrate. If nucleation sites 15 are present on the substrate, the reaction products 14 condense on the nucleation sites 15. Portions of the substrate where there is no deposition of condensates are etched. Reaction products 14 are condensed around the nucleation sites and on the side walls, blocking the etching action. Reference numeral 16 denotes etching gas decomposition products.

Some non-artificial nucleation sites may be present in the form of microscopic non-uniformities and adhering matter. However, providing artificial nucleation sites on the substrate makes it possible to condense etching gas or reaction products on a selective basis. The condensation initiation temperature varies according to the type and pressure of the gas, the type of substrate, the density and temperature of the plasma and the state of the substrate. If the substrate temperature is too low, condensation takes place over the entire substrate surface, preventing any etching from taking place. If the substrate temperature is too high, no condensation takes place, exposing the entire substrate surface to the etching. Setting the substrate temperature to somewhere in between to ensure that condensation takes place only at nucleation sites is therefore of key importance. The size of the condensates that form on the nucleation sites depends on the substrate temperature, the affinity between the substrate and the condensates and other such factors. However, controlling the conditions makes it possible to obtain relatively uniform condensates with dimensions in the 10 nm range. These condensates act as etching masks, enabling ultrafine fabrication on a 10 nm scale to be achieved.

The method used to form nucleation sites is not particularly limited, with any method being applicable that can be used to distribute microscopic non-uniformities or adhering matter on the substrate. Examples of methods that can be used to form nucleation sites include: (1) coating the substrate with a thin layer of an organic polymer substance that can be dissolved by an organic solvent, applying pressure to parts of the coating to make those parts insoluble and using an organic solvent to selectively dissolve away portions on which pressure has not been applied; (2) providing the substrate surface with fine mechanical defects; (3) depositing metal on the substrate surface; (4) depositing metal clusters on the substrate; and (5) irradiating the substrate surface with an ion beam or electron beam.

For the organic polymer substance used to form a film on the substrate in accordance with nucleation site formation method (1), any organic polymer may be used that is soluble in a certain type of organic solvent and has a certain degree of adhesion to the substrate. It is preferable to use a substance that reacts to pressure with an increase in the number of molecules, raising the density and making it insoluble or difficult to dissolve in an organic solvent.

The organic polymer can be a copolymer or a polymer comprised of at least one species of monomer, selected from the group consisting of: olefins such as ethylene, propylene and butylene; aromatic vinyl compounds such as styrene and α-methyl styrene; unsaturated carboxylic acids such as acrylic acid, methacrylic acid, 2-phenylacrylic acid, 2-acetylacrylic acid, maleic acid and fumaric acid; functional unsaturated carboxylic acid derivatives such as unsaturated carboxylic acid esters including methyl acrylate, ethyl acrylate, propyl acrylate, methyl methacrylate, ethyl methacrylate and propyl methacrylate, unsaturated carboxylic acid amides including acrylic amide, methacrylic amide, 2-phenylacrylamide and 2-acetylacrylamide, and unsaturated carboxylic acid hydrides including maleic anhydride; and unsaturated compounds such as vinyl acetate, vinyl chloride, vinylidene chloride, acrylonitrile and methacrylonitrile. Of these, (meta) acrylic ester polymers such as polyethyl acrylate and polymethyl methacrylate, and styrene plastics such polystyrene, are particularly suitable. It is preferable to use a polymer or copolymer with a molecular weight of from 1,000 to 2 million.

A thin layer of organic polymer can be formed on the substrate by spin-coating the substrate with a solution prepared by dissolving one of the above-described polymers or copolymers in a suitable solvent, and drying the coating. The thickness of the coating is preferably in the range of 10 nm to 100 nm. Pressure is then applied to the coating in the shape of the required pattern to adhere the pattern portions to the substrate. This makes the pattern portion insoluble or difficult to dissolve. Therefore, when the organic solvent is used, the polymer material of those portions to which pressure has not been applied is dissolved away, but the portions of the polymer adhered to the substrate by pressure remain on the substrate, unaffected by the solvent. The greater the application pressure, the higher the adhesion density of the polymer molecules. When the pressure is not so high, the polymer adheres molecule by molecule, so the pattern that is formed is as fine as the molecules. That is, even if pressure such as hydrostatic pressure, for example, is applied over the whole surface of the substrate, a fine pattern can be formed using dots of the size of the polymer molecules distributed over the whole surface. Moreover, when pressure is applied along the lines of the prescribed pattern, polymer is distributed within the region of applied pressure that is adhered at a density corresponding to the pressure used. Thus, fine patterns are formed from the large numbers of fine dots distributed within the prescribed region. The size of dots can be controlled by controlling the size of the polymer molecules. If a high enough pressure is used, the polymer adheres over the whole region to which the pressure was applied, making it possible to form a pattern along the lines of applied pressure. The pressure application means can be configured to form multiple patterns in parallel, thereby improving throughput.

There is no particular limitation on the organic solvent used to dissolve away the portions of the organic polymer film to which pressure is not applied. If polymethyl methacrylate is the polymer used, the solvent could be acetone, methyl ethyl ketone or diethyl ketone, or a mixture thereof. If the polymer used is polystyrene, an aromatic solvent could be used, such as toluene, for example. The substrate can be immersed in the solvent to remove the prescribed portions of the polymer film.

The pressure can be applied to the polymer film with a needle, by pressing the needle down onto the film or scratching the film with the needle. The adhesion density of the polymer depends on the scratch pressure, increasing as the pressure is increased. However, excessive pressure may damage the substrate itself, cause the polymer film separation force to exceed the adhesion force keeping the film in place or otherwise result in a decrease in adhesion density. There is no general rule about the degree of pressure to use, since it depends on the type of polymer film, the substrate material and the shape of the tip of the needle. However, in the case of a polymethyl methacrylate film on a silicon substrate that is to be scratched with a diamond needle 12 μm in diameter, a needle pressure may be used that is within a range of from 1 g to 100 g, and more preferably from 5 g to 30 g.

With reference to the method of scratching using a needle, the position of dots formed by the adhesion of polymer molecules cannot be controlled microscopically, but can be controlled macroscopically, and pressure can be used to control adhesion density. As such, this method is extremely useful in cases where dot positioning in microscopic terms is not required but very large numbers of dots need to be formed.

When the positioning does have to be controlled microscopically, a needle with an ultrafinely fabricated tip is used. Pressing the needle onto the prescribed locations allows ultrafine patterns to be formed at microscopically controlled positions. Ultrafine formations provided on the needle tip are transferred to the polymer film by pressing the tip of the needle onto the film. When the needle is used to scratch the polymer film, each of the individual surface features on the needle tip produces its own corresponding scratch pattern. One scratch with the needle is therefore equivalent to scratching the film with multiple fine needles. Thus, each scratch operation produces a number of lines of ultrafine dots corresponding to the number of surface features on the tip of the needle. Fine lines can be drawn by using a high-enough scratch pressure to join dots together.

An ultrafine pattern may also be formed by using the probe tip of an atomic force microscope (AFM) to adhere the polymer film to the substrate by sequentially pressing the tip against the film to form rows of dots. Fine patterns thus formed using polymer film form effective nucleation sites.

Fine mechanical defects formed on the substrate in accordance with the above method (2) produce nucleation sites. The needle of method (1) can also be used to form the mechanical defects of this method, by scratching the substrate. Microscopic control of the positioning of such defects is difficult, but macroscopic control is possible, and density can also be controlled. This method therefore is advantageous in cases where dots do not have to be positioned microscopically, but have to be formed in very large numbers. When microscopic positioning does have to be controlled microscopically, as in method (1), a needle with an ultrafinely fabricated tip can be used to produce the required defects. A defect thus formed on the substrate functions effectively as a nucleation site.

In method (3), nucleation sites are formed by depositing metal on the substrate. Sputtering or vacuum vapor deposition is used to form a deposition layer of gold or gold-palladium alloy or the like having an average thickness on the order of several nanometers. The film of deposited metal is used to form nanometric-scale islands as the nanometric sites. Positioning can be controlled macroscopically but not microscopically. If microscopic control is required, it can be done with a scanning tunneling electron microscope. When a voltage is applied across the gap between the tip of the microscope probe and the substrate, metal atoms stream off from the tip and are deposited on the substrate. The metal depositions thus formed on the substrate function effectively as nucleation sites.

In method (4), nucleation sites are formed by deposition of metal clusters. The clusters are created by condensation of metal vapor in a flowing stream of He gas. The size of the clusters is a few nanometers. The deposited clusters act as condensation nuclei.

In method (5), an ion beam or electron beam is projected onto the substrate to form nucleation sites. Blemishes are formed at the locations on which the beams impinge, or residual gas in the chamber of the projection apparatus is decomposed and deposited by the ion beam or electron beam. Thus, the irradiated portions function as nucleation sites. Both the ion beam radiation method and the electron beam radiation method allow the positions of nucleation sites to be controlled microscopically.

In the ultrafine fabrication method according to this invention, a substrate, more specifically, a substrate provided with surface nucleation sites, is dry etched at a condensation initiation temperature. The etching can be carried out using an electron cyclotron resonance (ECR) etching apparatus. This method has the advantage of enabling etching to be carried out without using a very high level of ion energy. As such, the condensates of etching gas or reaction products adhering to the nucleation sites to form the mask are not destroyed by the impact of the ions. Sulfur hexafluoride is a good etching gas for silicon substrates.

As described in the foregoing, in accordance with this invention the substrate is set at a temperature at which condensation of the etching gas, products of etching gas decomposed, recombined and reacted, or the products of reactions between the etching gas and the substrate material takes place. The nanometric-sized condensates thus formed are used as masks for the dry etching process. The method of this invention enables large numbers of nanometric-sized dots to be accurately formed in less time than conventional lithography methods.

The invention will now be explained in further detail using the following examples. However, the invention is not limited to these examples.

EXAMPLE 1

A 75-nm-thick coating of polymethyl methacrylate (PMMA) having an average molecular weight of approximately 600,000 and a dispersion degree of 3 or less was formed on a silicon substrate by the spin coating method. The coating was then scratched at a weight of 50 g applied with a tungsten needle with a 50-μm-diameter tip, and was then immersed in acetone for 2 minutes. The sample was then placed in an ECR etching apparatus and dry etched for 1 minute. (Etching gas: $SF_6$ at $1 \times 10^{-4}$ torr; microwave frequency and power: 2.45 GHz, 250 W, the sample was subjected to 13.56 MHz at 5 W.) At −140°, condensation covered the whole surface of the sample and no etching took place. At −120° C., etching took place over the whole surface. When a temperature of −130° C. was used, silicon pillars with a diameter of about 10 nm formed in the scratched area. It was therefore considered that in this case the condensation initiation temperature was −130° C.

Figure 3:
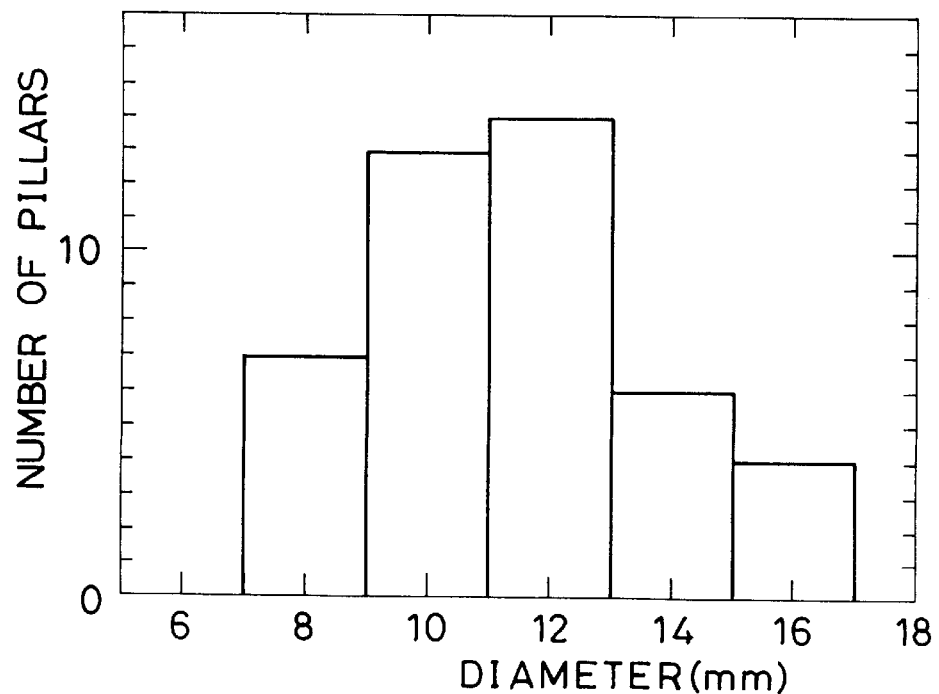
FIG. 3 is a graph showing the diameter distribution of silicon columns formed according to Example 1 of the invention.

The diameter distribution of the fabricated silicon pillars is shown in FIG. 3. The diameter distribution was from 7 nm to 17 nm. The average diameter was 11 nm, with a standard deviation of 2.5 nm. When polystyrene with an average molecular weight of around 1 million was used instead of PMMA, the silicon pillars formed were 10 nm in diameter and around 100 nm in height.

EXAMPLE 2

Sputtering was used to form a layer of gold with a nominal thickness of 1 nm on a silicon substrate. The deposited gold formed islands with a diameter of less than 5 nm. The sample was then placed in an ECR etching apparatus, cooled to −130° C., and dry etched for 1 minute, using the gold islands as nucleation sites. (Etching gas: $SF_6$ at $1\times10^{-4}$ torr; microwave frequency and power: 2.45 GHz, 250 W, the sample was subjected to 13.56 MHz at 5 W.) This resulted in the formation of silicon pillars with a diameter of around 10 nm.

EXAMPLE 3

A silicon substrate was cleaned in hydrofluoric acid and scratched with a tungsten needle. The diameter of the tip of the needle was 50 $\mu$m, and the scratch was made at a weight of 50 g. The sample was subjected to the same dry etching used in Example 2, which resulted in the formation of silicon pillars around 10 nm in diameter.

EXAMPLE 4

A silicon substrate was cleaned in hydrofluoric acid and then irradiated with $10^{13}/cm^2$ gold ions at 70 keV, using an ion beam focussed down to a diameter of 30 nm. When the sample was subjected to the same dry etching used in Example 2, the ion implantation sites were found to function as nucleation sites, resulting in the formation of silicon pillars around 30 nm in diameter.

EXAMPLE 5

A silicon substrate was cleaned in hydrofluoric acid and then irradiated by a 20 keV electron beam focussed down to a diameter of 10 nm, to form 2,000 dots at 0.01 $C/cm^2$. The sample was subjected to the same dry etching used in Example 2, resulting in the formation of 2,000 silicon pillars around 10 nm in diameter at the irradiated areas.

EXAMPLE 6

A silicon substrate was cleaned in hydrofluoric acid and a scanning tunneling electron microscope was then used to deposit gold dots on the substrate surface. For this, a voltage was applied to produce a sample bias of $-4$ V, a tunneling current of 10 nA and a pulse width of 10 ms. When the sample was subjected to the same dry etching used in Example 2, silicon dots around 10 nm in diameter were formed on the gold deposit regions.

EXAMPLE 7

A 75-nm-thick coating of PMMA having an average molecular weight of approximately 600,000 and a dispersion degree of 3 or less was formed on a silicon substrate by the spin coating method. The probe tip of an AFM was then used to form a row of dots by pressing down on the coating at a pressure of 10 GPa. The sample was then immersed in acetone for 2 minutes and dry etched by the same process used in Example 2, resulting in the formation of silicon dots around 10 nm in diameter where the probe had been used.

EXAMPLE 8

Clusters each consisting of 720 silver atoms were deposited on a silicon substrate at a deposition density of $10^{10}$ $cm^{-2}$. The diameter of the clusters was 5 nm or less. When the sample was subjected to the same dry etching used in Example 2, the result was the formation of silicon pillars around 20 nm in diameter and 100 nm in height, at a density of about $10^{10}$ $cm^{-2}$.

EXAMPLE 9

Silver clusters were deposition-formed on silicon substrates. The clusters consisted of 100, 200, 300, 400, and 600 silver atoms, which were deposited on the substrates at a density of $10^{10}$ $cm^{-2}$. When the samples were subjected to the same dry etching used in Example 2, the result was that no pillars were formed on clusters of 100 and 200 silver atoms, while silicon pillars were formed on clusters of 300 or more silver atoms. The pillars were 100 nm in height, and with an average diameter of 16 nm in the case of 300-atom clusters, 17 nm in the case of 400-atom clusters, and 18 nm in the case of 600-atom clusters.

EXAMPLE 10

Electrolysis was conducted using an n-type silicon substrate as the cathode and silver as the anode. The surface area of the cathode was 9 $cm^2$. After applying $1\times10^{-8}$ F of electricity, the sample was cleaned in pure water and subjected to the same dry etching used in Example 2. Silver deposited on the silicon surface by the electrolysis formed nucleation sites on which silicon pillars formed, the pillars being around 30 nm in diameter and 100 nm in height.

What is claimed is:

1. An ultrafine fabrication method in which dry etching is used to form ultrafine structures on a substrate, comprising:

forming nucleation sites on a substrate where condensates are to be formed;

cooling the substrate in an etching gas to a condensation initiation temperature to thereby form condensates on the nucleation sites; and dry-etching the substrate using the condensates thus formed as an etching mask.

2. The fabrication method according to claim 1, wherein the condensation initiation temperature is about $-130°$ C.

3. The fabrication method according to claim 1, wherein the etching gas is $SF_6$.

4. The fabrication method according to claim 1, wherein the nucleation sites are formed by applying a layer of an organic polymer that is soluble in an organic solvent on the substrate, applying pressure to the layer at locations at which it is desired to form a nucleation site, and selectively removing portions of the organic polymer to which pressure has not been applied.

5. The fabrication method according to claim 4, wherein the organic polymer is selected from the group consisting of acrylic ester polymers, methacrylic ester polymers and styrene plastics.

6. The fabrication method according to claim 1, wherein the nucleation sites are formed by depositing metal on the substrate.

7. The fabrication method according to claim 1, wherein nucleation sites are formed by forming fine mechanical defects on the substrate.

8. The fabrication method according to claim 1, wherein the nucleation sites are formed by ion-beam irradiation of the substrate.

9. The fabrication method according to claim 1, wherein the nucleation sites are formed by electron-beam irradiation of the substrate.

10. The fabrication method according to claim 1, wherein the dry etching is done by electron cyclotron resonance.

11. The fabrication method according to claim 6, wherein said metal comprises metal clusters.

12. An ultrafine fabrication method in which dry etching is used to form ultrafine structures on a substrate, comprising:

forming a nucleation site on a substrate where a condensate is to be formed;

placing the substrate in an etching gas;

setting the substrate at a temperature at which at least one of the etching gas, products of the etching gas which have been decomposed, recombined and reacted, and products of the reaction between the etching gas and the substrate, initiates condensation, thereby forming a condensate at the nucleation site; and dry-etching the substrate using the condensate thus formed as an etching mask.

13. The fabrication method according to claim 12, wherein the temperature is about −130° C.

14. The fabrication method according to claim 12, wherein the etching gas is $SF_6$.

* * * * *